United States Patent [19]
Nishimura et al.

[11] Patent Number: 5,962,148
[45] Date of Patent: Oct. 5, 1999

[54] ELECTRICALLY CONDUCTIVE PAINT COMPOSITION

[75] Inventors: Yoshio Nishimura; Toshiharu Otsuka; Masatoshi Murashima, all of Osaka; Kouji Maruyama, Shiga; Minoru Suezaki, Saitama, all of Japan

[73] Assignee: Sekisui Chemical Co., Ltd., Osaka, Japan

[21] Appl. No.: 08/700,434

[22] PCT Filed: Oct. 4, 1995

[86] PCT No.: PCT/JP95/02020

§ 371 Date: Sep. 5, 1996

§ 102(e) Date: Sep. 5, 1996

[87] PCT Pub. No.: WO96/21699

PCT Pub. Date: Jul. 18, 1996

[30] Foreign Application Priority Data

Jan. 11, 1995 [JP] Japan .................................. 7-002419

[51] Int. Cl.$^6$ ................ B32B 27/30; H01B 1/12
[52] U.S. Cl. ............ 428/522; 428/336; 428/447; 428/704; 428/913; 252/500; 252/519.12; 252/519.21; 252/520.2; 156/230; 156/235
[58] Field of Search ............ 252/500, 519.12, 252/519.21, 520.2; 428/336, 522, 704, 913, 447; 156/235, 230

[56] References Cited

U.S. PATENT DOCUMENTS

| | | |
|---|---|---|
| 5,218,363 | 6/1993 | LeCroy, Jr. et al. . |
| 5,324,583 | 6/1994 | Ozaki . |
| 5,378,403 | 1/1995 | Shacklette . |
| 5,552,216 | 9/1996 | Sugimoto et al. .................. 252/500 X |
| 5,686,186 | 11/1997 | Enlow et al. ..................... 428/424.6 X |

FOREIGN PATENT DOCUMENTS

| | | |
|---|---|---|
| 0 497 514 | 8/1992 | European Pat. Off. . |
| 0 591 951 | 4/1994 | European Pat. Off. . |
| 591 951 A1 | 4/1994 | European Pat. Off. . |
| 60-60166 | 4/1985 | Japan . |
| 1-131288 | 5/1989 | Japan . |
| 3-137121 | 6/1991 | Japan . |
| 6-240180 | 8/1994 | Japan . |
| 6-248202 | 9/1994 | Japan . |
| 6-316687 | 11/1994 | Japan . |

OTHER PUBLICATIONS

Chem. Abs. 1995:389740 of JP 06–263899, Sep. 1994.

*Primary Examiner*—Fred Teskin
*Attorney, Agent, or Firm*—Nikaido Marmelstein Murray & Oram

[57] ABSTRACT

The present invention is an electrically conductive paint composition comprising 100 parts by weight of a (meth) acrylate compound having at least two (meth)acryloyl groups in one molecule, 0.1 to 30 parts by weight of a particulate anilinic electrically conductive polymer, 1 to 100 parts by weight of an alkyl (meth)acrylate resin, 0.01 to 10 parts by weight of a photopolymerization initiator and 0 to 2000 parts by weight of an organic solvent. The compositions can be easily cured by active rays of light. The resulting electrically conductive film is excellent in surface hardness, transparency, resistance to chemicals, and abrasion resistance, and the paint compositions being excellent in storability. Thus, the electrically conductive paint compositions are suitable for antistatic materials in semiconductor-preparating processes.

17 Claims, No Drawings

ELECTRICALLY CONDUCTIVE PAINT COMPOSITION

TECHNICAL FIELD

This invention relates to electrically conductive paint compositions suitable for antistatic materials in semiconductor-preparating processes, and more particularly to electrically conductive organic paint compositions which are easily cured by active rays of light such as ultraviolet rays and visible rays or heating, and the obtained coating film is excellent in electrical conductivity.

BACKGROUND ART

Electrically conductive organic polymers are being practically applied as electrically conductive fillers for electronic devices making use of the property as semiconductor, electrochromic materials utilizing the changes of absorption wavelength at the time of oxidation or reduction, battery electrode materials, electrochemical active substances, antistatic and electromagnetic wave shielding materials, etc.

In particular, electrically conductive polymers such as polythiophene, polypyrrole and polyaniline are stable in the air, and those with the electrical conductivity of 100 S/cm or more are electrically conductive polymers suited to practical use.

These electrically conductive polymers are treated by doping for forming a complex of a dopant and an electrically conductive organic polymer in order to provide them with an electrical conductivity of more than 1 S/cm. As this treatment, in such electrically conductive organic polymers as polypyrrole and polythiophene, it is relatively easy to dope by using gaseous dopant such as iodine and arsenic pentafluoride.

In this method, however, as the dopant is released from the electrically conductive polymer with the lapse of time, and the electrical conductivity is lowered.

In another doping such as a method of doping with anions by an electrochemical technique, although the electrical conductivity is relatively stable, the treating process is complicated, and it is not suited to mass production.

Electrically conductive materials including polyanilines show a stable electrical conductivity by the use of inorganic or organic protonic acid as dopant, Japanese Laid-open Patent Publication Hei 1-131,288 discloses a method of preparing an excellent paint by dissolving such doped polyanilines or polymer of aniline derivatives in a solvent. The doped polyanilines or polymer of aniline derivatives, however, dissolve only specified solvents such as N,N-dimethylformamide and N-methyl-2-pyrolidone, etc. In addition, the coating film formed with the above-mentioned doped polyanilines have problems that the coating film hardness, resistance to solvent and resistance to chemicals are poor, that protonic acid as dopant effuses when it contacts with solvent or separates from polyanilines when it contact with alkalis, so that electrically conductivity falls. There is also an attempt to prepare a paint by dispersing divided polyaniline or polymer of aniline derivatives in paint binder without dissolving them in solvent. However, it is impossible to form a coating film good in electric conductivity and transparency, unless the above-mention polymers are dispersed in solvents thoroughly. Actually, a coating film which has good in hardness, electric conductivity and transparency has not been obtained as yet.

Japanese Laid-open Patent Sho. 60-60,166 proposes a paint which is cured by ultraviolet ray or visible ray in order to improve the hardness and resistance to solvent.

This paint is excellent in electrical conductivity and transparency, but since inorganic electrically conductive materials are contained, it is not easy to disperse the materials in the binder, a large amount of dispersant is needed, and moreover it takes a long time in dispersing them in the binder, and even after dispersing, because of re-coagulation, the storage life of the paint is poor.

Further, Japanese Laid-open Patent Hei 3-137,121, U.S. Pat. No. 5,378,403, U.S. Pat. No. 5,218,363, and U.S. Pat. No. 5,324,583 also disclose electrically conductive compositions containing anilinic polymers.

This invention is provided to solve the problems.

It is a primary object of the invention to present an electrically conductive paint composition capable of forming a coating film excellent in transparency, hardness, resistance to solvent and resistance to chemicals especially to alkali, being easily cured, and the paint composition being excellent in storability.

The other object of the invention is to present an antistatic transparent articles coated with electrically conductive film having such excellent properties as mentioned above.

DISCLOSURE OF THE INVENTION

The invention presents an electrically conductive paint composition comprising 100 parts by weight of a (meth) acrylate compound having at least two (meth)acryloyl groups in one molecule, 0.1 to 30 parts by weight of a particulate anilinic electrically conductive polymer, 1 to 100 parts by weight of an alkyl (meth)acrylate resin, 0.01 to 10 parts by weight of a photopolymerization initiator and 0 to 2000 parts by weight of an organic solvent.

The (meth)acrylate compound having at least two (meth) acryloyl groups in one molecule, which is a component of the composition, works as binder, and the particulate anilinic electrically conductive polymer is dispersed in the (meth) acrylate compound.

In particular, the (meth)acrylate compound has at least four (meth)acryloyl groups in one molecule is preferable.

The (meth)acrylate compound can be a compound of which polymerization is initiated by irradiating it with active rays of light such as ultraviolet ray or visible ray, or by heating it, so that crosslinking takes place to cure the film.

Examples of (meth)acrylate compound include, among others, ethyleneglycol di(meth)acrylate, diethyleneglycol di(meth)acrylate, triethyleneglycol di(meth)acrylate, tetraethyleneglycol di(meth)acrylate, nonaethyleneglycol di(meth)acrylate, polyethyleneglycol di(meth)acrylate, triproplyleneglycol di(meth)acrylate, tetrapropyleneglycol di(meth)acrylate, nonapropyleneglycol di(meth)acrylate, polypropyleneglycol di(meth)acrylate, pentaerythritol tri (meth)acrylate, dipentaerythritol penta(meth)acrylate, dipentaerythritol hexa(meth)acrylate, trimethylolpropane tri (meth)acrylate, glycerol tri(meth)acrylate, tris-(2-hydroxyethyl)-isocyanuric ester (meth)acrylate, 2,2-bis[4-acryloxy diethoxy)phenyl]propane, 2,2-bis[4-methacryloxy diethoxy)phenyl]propane, 3-phenoxy-2-propanoyl acrylate, 1,6-bis(3-acryloxy-2-hydroxypropyl)hexyl ether, tetramethylolmethane tetra(meth)acrylate, dipentaerythritol tetra (meth)acrylate, pentaerythritol tetra(meth)acrylate, ditrimethylolpropane tetraacrylate, and caprolactone-modified dipentaerythritol hexaacrylate.

Besides, (meth)acrylate compound possessing urethane bond within a molecule may be preferably used because it is excellent in hardness and the abrasion resistance of the coating film.

Examples of such (meth)acrylate compound include, among others, urethane prepolymers of pentaerythritol triacrylate hexamethylene diisocyanate, pentaerythritol triacrylate isophorone diisocyanate, pentaerythritol triacrylate tolylene diisocyanate, etc. Further, polyester (meth)acrylate compound which is based on ester bond and possesses at least two acryloyl groups in a molecule can be used as (meth)acrylate compound. Such polyester (meth)acrylate compound can be cured to form highly crosslinked structure so as to give high surface hardness and abrasion resistance to the resulting organic electrically conductive film.

Anilinic electrically conductive polymer used in the invention is a polymer of aniline or anilinic derivatives. Conventional anilinic electrically conductive polymer can be used without limitation, and commercially available, for example "Versicon" produced by Allied Signal Inc,.

Anilinic electrically conductive polymer is particulate. Usually primary particles agglomerate to give bigger particle having 3 to 100 μm of diameter.

The anilinic electrically conductive polymer has a mean particle size of preferably 1 μm or less, more preferably 0.4 μm or less, most preferably 0.1 μm or less.

Examples of anilinic derivative monomer include, among others, N-methyl aniline, N-ethyl aniline, diphenyl aniline, o-toluidine, m-toluidine, 2-ethyl aniline, 3-ethyl aniline, 2,4-dimethyl aniline, 2,5-dimethyl aniline, 2,6-dimethyl aniline, 2,6-diethyl aniline, 2-methoxy aniline, 4-methoxy aniline, 2,4-dimethoxy aniline, o-phenylene diamine, m-phenylene diamine, 2-aminobiphenyl, N,N-diphenyl-p-phenylene diamine.

The electrical conductivity of electrically conductive film formed by applying the electrically conductive paint composition of the invention can be varied in the range of $10^1$ to $10^{11}$ $\Omega/\square$ of surface intrinsic resistance, depending on the amount of the obtained anilinic polymer and thickness of the resulting film.

If the amount of the anilinic polymer is too low, the electrical conductivity of the obtained film is insufficient, and if too high, the effect of protecting anilinic polymer by crosslinked binder decreased, so that abrasion resistance, chemical resistance, solvent resistance etc. are lowered.

The amount of the anilinic electrically conductive polymer is 0.1 to 30 parts by weight, preferably 0.1 to 10 parts by weight, more preferably 0.1 to 5 parts by weight to 100 parts by weight of the (meth)acrylate compound.

The photopolymerization initiator used in the invention can be an initiator which has properties of initiating polymerization of (meth)acrylate compound with active rays of light such as ultraviolet ray or visible ray.

Examples of the photopolymerization initiator activated by ultraviolet ray include, among others, sulfides such as sodium methyl dithiol carbamate sulfide, tetramethylthiuram monosulfide, diphenyl monosulfide, dibenzothiazoyl monosulfide, and dibenzothiazoyl disulfide; thioxanthone derivatives such as thioxanthone, ethylthioxanthone, 2-chlorothioxanthone, diethylthioxanthone and diisopropylthioxanthone; diazo compounds such as hydrazone, azobisisobutyronitrile, and benzene diazonium; aromatic carbonyl compounds such as benzoin, benzoin methyl ether, benzoin ethyl ether, benzoin isopropyl ether, benzophenone, dimethyl aminobenzophenone, Michler's ketone, benzyl anthraquinone, t-butyl anthraquinone, 2-methyl anthraquinone, 2-ethyl anthraquinone, 2-amino anthraquinone, 2-chloro anthraquinone, benzyl dimethyl ketal, and methyl phenyl glyoxylate; acetophenone derivatives such as 4-(2-hydroxyethoxy)phenyl(2-hydroxy-2-propyl) ketone, α-hydroxy-α, α'-dimethylacetophenone, 2,2-diethoxyacetophenone, 2,2-dimethoxyacetophenone; dialkylaminobenzoates such as methyl 2-dimethylaminobenzoate, ethyl p-dimethylaminobenzoate, butyl p-dimethylaminobenzoate, and isopropyl p-diethylaminobenzoate; peroxides such as benzoyl peroxide, di-t-butyl peroxide, dicumyl peroxide, and cumene hydroperoxide; acridine derivatives such as 9-phenyl acridine, 9-p-methoxyphenyl acridine, 9-acetyl aminoacridine, and benzacridine; phenadine derivatives such as 9,10-dimethyl benzphenadine, 9-methyl benzphenadine, and 10-methoxy benzphenadine; quinoxaline derivatives such as 4',4",6-trimethoxy-2,3-diphenyl quinoxaline; 2,4,5-triphenyl imidazoyl dimer; ketone halide; and acylated phosphoratecompounds such as acylphosphinoxide, and acylphosphonate.

Examples activated by visible rays include, among others, 2-nitrofluolene, 2,4,6-triphenylpyridium tetrafluoric borate, 2,4,6-tris(trichloromethyl)-1,3,5-triazine, 3,3'-carbonyl biscumarine, and thio Michler's ketone.

The amount of the photopolymerization initiator is 0.01 to 10 parts by weight, preferably 0.02 to 5 parts by weight, more preferably 0.05 to 3 parts by weight to 100 parts by weight of the (meth)acrylate compound.

The (meth)acrylate resin used in the electrically conductive paint composition of the present invention works as dispersant which disperses the anilinic electrically conductive polymer in the (meth)acrylate compound as binder.

Examples of the (meth)acrylate monomer compound include, among others, methyl (meth)acrylate, ethyl (meth) acrylate, propyl (meth)acrylate, butyl (meth)acrylate, 2-ethylhexyl (meth)acrylate. Examples of the homopolymer or copolymer of the (meth)acrylate include, among others, methyl (meth)acrylate polymer, ethyl (meth)acrylate polymer, propyl (meth)acrylate polymer, butyl (meth) acrylate, 2-ethylhexyl (meth)acrylate polymer, butyl (meth) acrylate/methyl (meth)acrylate copolymer.

If the molecular weight of the alkyl (meth)acrylate resin is too low, the dispersion properties decrease, so that transparency and electrical conductivity of the obtained organic electrically conductive film are lowered, the effect on thickening electrically conductive polymer paint is not exhibited, and the application properties of the paint deteriorate. If the molecular weight of the alkyl (meth)acrylate resin is too high, the viscosity of the paint becomes high excessively, so that the application properties of the paint deteriorate.

The alkyl (meth)acrylate resin has a molecular weight of preferably 100,000 to 1,000,000, preferably 300,000 to 800,000.

If the amount of the alkyl (meth)acrylate resin is too low, the above-mentioned dispersing effect is not exhibited, so that transparency and electrical conductivity of the obtained organic electrically conductive film are lowered, the effect on thickening electrically conductive polymer paint is not exhibited either, and the application properties of the paint deteriorate, and if too high, the abrasion resistance of the obtained film deteriorates.

The amount of the alkyl (meth)acrylate resin is 1 to 100 parts by weight, preferably 3 to 50 parts by weight, more preferably 5 to 25 parts by weight to 100 parts by weight of the (meth)acrylate compound.

The organic solvent used optionally in the electrically conductive paint composition of the present invention can be a solvent which does not dissolve the anilinic polymer and dissolves the alkyl (meth)acrylate compound and the alkyl (meth)acrylate resin. The organic solvent which has a too low boiling point or is high volatility brings about thickening of paint because of evaporation during applying, while the organic solvent having high boiling point takes long period of time for drying. Solvents having boiling point of about 70 to 160° C. are preferable. Examples of the solvent include, among others, cyclohexanone, ethyleneglycol monomethylether (methyl cellosolve), ethyleneglycol monoethylether (ethyl cellosolve), diethyleneglycol dimethylether, butyl acetate, isopropylacetone, methylethylketone, toluene, xylene, anisole, and mixture thereof, The amount of the solvent is 0 to 5000 parts by weight, preferably 5 to 1500 parts by weight, more preferably 100 to 1000 parts by weight to 100 parts by weight of the (meth)acrylate compound.

The electrically conductive paint composition of the invention may contain additives such as ultraviolet absorber, antioxidant, thermopolymerization inhibitor and others as required.

Examples of the ultraviolet absorber include, among others, salicylic acid ultraviolet absorber, benzophenone ultraviolet absorber, benzotriazole ultraviolet absorber, cyanoacrylate ultraviolet absorber. Examples of the antioxidant include, phenolic antioxidant, phosphorus antioxidant, sulfur antioxidant. Examples of the thermopolymerization inhibitor include, hydroquinone, p-methoxyphenol.

The above-mentioned photopolymerization initiator may contain amine compounds which accelerate photopolymerization in order to prevent photopolymerization velocity from being lowered by oxygen inhibition. Such amine compounds can be aliphatic amines, aromatic amines which are nonvolatile. Triethanolamine, methyldiethanolamine, etc. can be used. Photopolymerization initiator possessing amino group such as dialkylaminobenzoates, Michler's ketone can also be used as the amino compound.

If the amount of the amino compound is too low, the photopolymerization velocity of (meth)acrylate compound is lowered so that the crosslinking is insufficient, and even if too high, the photopolymerization velocity reachs a plateou.

The amount of the amino compound is 0.01 to 10 parts by weight to 100 parts by weight of the (meth)acrylate compound.

As a method of preparing the anilinic electrically conductive polymer, for example, aniline or its derivative monomer and acid are dissolved in a solvent such as water or dimethylformamide (DMF), and an oxidizer solution is dropped in this solution with stirring to conduct oxidation polymerization of monomer.

In the oxidation and polymerization method the preferred monomer concentration in the reaction solution is 0.1 to 1 mole/liter.

Examples of the acid include, among others, an inorganic protonic acid such as hydrochloric acid, sulfuric acid or nitric acid; organic acid such as p-toluenesulfonic acid. Preferred acid concentration is 0.1 to 1 N.

Examples of the oxidizing agent include, among others, persulfate, hydrogen peroxide, permanganate, lead dioxide, dichromate, manganese dioxide and ferric chloride. Preferred concentration of the oxidizing agent is 0.1 to 1 mole/liter.

The alkyl (meth)acrylate resin can be produced by a conventional method such as solution polymerization method, emulsion polymerization method, suspension polymerization method, or bulk polymerization method.

The electrically conductive paint composition of the invention is obtained by mixing the alkyl (meth)acrylate resin, the anilinic electrically conductive polymer, optionally the solvent and agitating the resulting mixture to divide the anilinic electrically conductive polymer into 1 $\mu$m or less, preferably 0.4 $\mu$m or less, more preferably 0.1 $\mu$m or less, followed by adding (meth)acrylate compound, the photopolymerization initiator, and optionally the additives.

The mixing is carried out by means of a conventional mixing device such as sandmill, ballmill, attritor, high rotation speed agitator, three rolls, and others.

Objects of application of the electrically conductive paint composition include, for example, resin article such as film, sheet, plate or injection-molded article made of polyethylene, polypropylene, polymethacrylate, polyvinyl chloride, polycarbonate, polyethylene terephthalate, ABS resin, glass fiber reinforced plastic forms (FRP), polyimide, polyether ether ketone, polysulfone, polyphenylenesulfide, polyethersulfone, fluorite resin; metallic plate covered with glass ceramic or resin.

The prepared electrically conductive paint composition is applied on the objects by general method such as spray method, bar coating method, doctor blade method, roll coating method, or dipping method.

Examples of active ray include rays emitted from each source such as (ultra-)high pressure mercury lamp, halogen lamp, xenon lamp; nitrogen laser, He-Cd laser, Ar laser, and the like.

The irradiation intensity of active rays is preferred to be 50 to 5000 mJ/cm$^2$. If it is too low, the curing of the obtained coating film is insufficient, and thereby abrasion resistance, hardness, etc. are lowered. If it is too high, the coating film is colored, thereby transparency is lowered.

The second electrically conductive paint composition is composed by adding a silane coupling agent and/or titanate coupling agent to the above-mentioned first electrically conductive paint composition.

The above-mentioned silane coupling agent increases dispersion of anilinic polymer in (meth)acrylic compound or organic solvent.

Examples of the silane coupling agent include, among others, vinyl triethoxysilane, vinyl trimethoxysilane, vinyl tris($\beta$-methoxyethoxy)silane, $\gamma$-methacryloxypropyltrimethoxysilane, $\beta$-(3,4-epoxycyclohexyl)ethyltrimethoxysilane, $\gamma$-glycidoxypropyltrimethoxysilane, $\gamma$-mercaptopropyltrimethoxysilane, $\gamma$-aminopropyltriethoxysilane, N-$\beta$-(aminoethyl)-$\gamma$-aminopropyltrimethoxysilane, $\gamma$-ureidopropyltriethoxysilane, phenyltriethoxysilane, methyltriethoxysilane, methyltrimethoxysilane, polyethyleneoxide modified-silane monomer, polymethylethoxysiloxane, hexamethyldisilazane.

The above-mentioned titane coupling agent can be used for the same purpose, too.

Examples of the titane coupling agent include, among others, isopropyltriisostearoyltitanate, tetraisopropyl bis(dioctylphosphate)titanate, tetraoctyl bis(ditridecylphosphate)titanate, tetra(2,2'-diallyloxymethyl-1-butyl) bis(di-tridecyl) phosphate titanate, isopropyltridecyl benzenesulfonyltitanate, bis(dioctylpyrophosphate) oxyacetate titanate, bis(dioctylpyrophosphate) ethylenetitanate, isopropyltrioctanoyltitanate, isopropyldimethacrylisostearoyltitanate, isopropylisostearoyldiacryltitanate, isopropyltri (dioctylphosphate)titanate, isopropyltricumylphenyltitanate, isopropyltri(N-aminoethyl-aminoethyl)titanate, etc.

The particulate anilinic polymer can be treated with the coupling agents in advance. Examples of the treating method include a method wherein the coupling agent is added or sprayed to anilinic polymer with stirring, and a method wherein the coupling agent is dissolved in a solvent, to the resulting solution is added the anilinic polymer to give a mixture and then the solvent is evapolated from the mixture. The coupling agents may be dissolved in the solvent to be used for the electrically conductive paint composition of the present invention, followed by mixing the resulting solution with the particulate anilinic polymer.

If the amount of the coupling agent is too low, its adhesion to the particle surface of anilinic electrically conductive polymer is not insufficient, so that the electrically conductive film obtained loses transparency, and if too high, the hardness of the film is lowered.

The amount of the coupling agent is 0.1 to 10 parts by weight, preferably 0.2 to 8 parts by weight to 100 parts by weight of the (meth)acrylate compound.

In the second electrically conductive paint composition, the other components than the coupling agent, objects to which the paint composition is applied, and the electrically conductive film obtained can be the same as those of the first electrically conductive paint composition.

Next, the third electrically conductive paint composition is described.

The third electrically conductive paint composition comprises 100 parts by weight of (meth)acrylate compound having at least two (meth)acryloyl groups in one molecule, 0.1 to 30 parts by weight of particulate anilinic electrically conductive polymer, 1 to 100 parts by weight of alkyl (meth)acrylate resin, 0 to 200 parts by weight of thermosetting resin and 0 to 10 parts by weight of a curing agent.

The thermosetting resin can be any resin which is crosslinked and cured by heating. Examples of the thermosetting resin include unsaturated polyester resin, epoxy resin, urethane resin and the like.

Usual unsaturated polyester resin, which is produced by dissolving unsaturated polyester in polymerizable monomer, can be used. The unsaturated polyester can be produced by known method such as esterifying unsaturated polybasic acid (or anhydride) with polyvalent alcohol.

Examples of the unsaturated polybasic acid include, among others, maleic anhydride, maleic acid, fumaric acid, itaconic acid, carbic acid, carbic anhydride, etc. If necessary, to the unsaturated polybasic acid can be added a saturated polybasic acid such as phthalic anhydride, isophthalic acid, terephthalic acid, monochlorophthalic acid, adipic acid, cinnamic acid or sebacic acid.

Examples of the polyvalent alcohol include, among others, glycols such as ethyleneglycol, diethyleneglycol, propyleneglycol, dipropyleneglycol, triethyleneglycol, butanediol, neopentylglycol, hydrogenated bisphenol A and bisphenol A ethyleneoxide adducts; tri- or higher valent alcohols such as pentaerythritol, glycerol and trimethylolpropane.

Examples of the polymerizable monomer used to dissolve the above-mentioned unsaturated polyester include, among others, styrene, vinyltoluene, divinylbenzene, methyl (meth) acrylate, ethyl methacrylate.

The unsaturated polyester is cured using organic peroxides such as methylethylketoneperoxide, benzoylperoxide, cumenehydroperoxide, lauroylperoxide; azo compounds such as azobisisobutyronitrile as curing agent or polymerization initiator. Curing accelerators can be used together with them. Examples of the curing accelerator include, among others, metal soaps such as cobalt naphthenate, cobalt octenoate, manganese naphthenate; aromatic tertiary amines such as dimethyl aniline; quaternary ammonium salts such as dimethyl benzyl ammonium chloride.

The epoxy resins used can be a known epoxy resin which has epoxy group(s) and can be cured with curing agents. Examples of the epoxy resins include, among others, bisphenol A type epoxy resins, novolak type epoxy resins and aliphatic epoxy resins.

Examples of the curing agents of epoxy resins include, among others, amines such as diethylenetriamine, triethylenetetramine, and metaphenylenediamine; acid anhydrides such as phthalic anhydride, tetrahydrophthalic anhydride, hexahydrophthalic anhydride; polyamine curing agents; polyamide curing agents; polysulfide curing agents.

The above-mentioned urethane resins are mixture of a polyol and a compound possessing at least two isocyanate groups within a molecule, and cause addition-polymerization between the polyol and the compound to be cured.

Examples of polyol include, among others, short-chain diols such as ethyleneglycol, 1,2-propane diol, 1,3-propane diol, neopentyl glycol, 1,2-butane diol, 1,3-butane diol, 1,4-butane diol, 2,3-butane diol, 1,5-heptane diol, 1,6-hexane diol, diethyleneglycol, dipropyleneglycol, and trimethylolpropane. Polyethyleneglycol, polypropyleneglycol, polyoxytetramethyleneglycol and the like can be used, too.

Other polyols include condensed polyester glycol, which are condensation products of adipic acid and ethyleneglycol, adipic acid and propane diol, adipic acid and neopentyl glycol, adipic acid and butane diol, and adipic acid and hexane diol.

The compounds possessing at least two isocyanate groups within a molecule include, for example, hexamethylene diisocyanate, methylene diphenyl diisocyanate, toluene-3,5-diisocyanate, xylene diisocyanate, methylene dicyclohexyl diisocyanate.

Urethane resins are not always necessary, but it is better to use them. The curing agents of urethane resins include, for example, triethylamine, triethylenediamine, triethanolamine, stannous octoate, dibutyltin laurate, and dibutyltin 2-ethylhexoate.

The amount of the thermosetting resin is 0 to 200 parts by weight, preferably 10 to 100 parts by weight, more preferably 15 to 60 parts by weight to 100 parts by weight of the (meth)acrylate compound.

The amount of the curing agent of thermosetting resin is 0 to 10 parts by weight, preferably 0.01 to 8 parts by weight, more preferably 0.02 to 5 parts by weight to 100 parts by weight of the (meth)acrylate compound.

In the third electrically conductive paint composition, the other components than the thermosetting resin and curing agent, that is, (meth)acrylate compound having at least two (meth)acryloyl groups in one molecule, particulate anilinic electrically conductive polymer having a mean particle size of 1 μm or less, and alkyl (meth)acrylate resin can be the same as those of the first electrically conductive paint composition.

The objects to which the third electrically conductive paint composition is to be applied, and the electrically conductive film obtained can be the same as those of the first electrically conductive paint composition.

After applying the third electrically conductive paint composition on the object in the same manner as in the first invention, it is heated so as to cure the paint composition, thereby obtaining a coating film of the electrically conductive paint.

This invention relates to a molded article coated with an electrically conductive film made of the first, second or third electrically conductive paint composition.

Examples of the above-mentioned molded articles include, among others, those which is obtained by applying the above-mentioned electrically conductive paint composition on a release film to form a coating, and laminating the resulting coating on a transparent plastic molded article, releasing the release film from the coating, and curing the coating to form the electrically conductive film.

When the electrically conductive paint composition is photo-setting type paint composition, it is irradiated with active rays of light such as ultraviolet ray or visible ray, so that the paint composition is cured thereby obtaining a coating film of the electrically conductive paint.

When the electrically conductive paint composition is thermosetting type paint composition, it is heated under desired conditions, so that the paint composition is cured thereby obtaining a coating film of the electrically conductive paint.

The preferred articles to which the paint is applied include, for example, transparent plastic molded articles such as a film, a sheet, a plate and a container.

The materials of the article include, for example, polyvinyl chloride, acrylic resins, ABS resin, polycarbonate, polyethylene terephthalate, polyether ether ketone, polyphenylenesulfide, polysulfone, polyimide, polyetherimide, fluorocarbon resin.

The prepared electrically conductive paint composition is applied on the objects by general methods such as spray method, bar coating method, doctor blade method, roll coating method, and dipping method.

To laminate the resulting coating on a transparent plastic molded article, the coating is hot-pressed on the molded article. The release film can be released from the coating after the electrically conductive film is formed. The preferred release film is transparent plastic film which has a smooth surface and include, for example, polyolefin film, polyester film, polyester biaxial orientated film. The higher is the smoothness of the film surface, the higher is the smoothness of the electrically conductive film, so that transparent plastic molded antistatic articles having high surface smoothness can be obtained.

The electrically conductive film is preferably 0.5 to 10 $\mu$m in thickness, because the electrically conductivity is not sufficient if too thin, and the transparency decreases if too thick.

In addition, the present invention provides a molded article coated with an electrically conductive film, which is obtained by forming a transparent resin layer on a molded article, and then applying any one of the first, the second and the third electrically conductive paint composition on the resin layer to form the electrically conductive film. The above-mentioned transparent resin layer is interlaid between the molded article and the electrically conductive film to increase adhesion between them.

The first embodiment of the molded article having the interlayer is obtained by applying the above-mentioned electrically conductive paint composition on a release film to form a coating, curing the coating to form the electrically conductive film, forming a transparent resin layer on a transparent plastic molded article, laminating the electrically conductive film of the release film on the transparent resin layer of the molded article, and releasing the release film from the electrically conductive film.

The second embodiment of the molded article having the interlayer is obtained by applying the electrically conductive paint composition according to any one of claims 1 to 11 on first release film to form a coating, curing the coating to form the electrically conductive film, forming a transparent resin layer on second release film, laminating the transparent resin layer of the second release film on a transparent molded article, releasing the second release film from the transparent resin layer, laminating the electrically conductive film of the first release film on the transparent resin layer transferred on the molded article, and releasing the first release film from the electrically conductive film.

An example of the process for preparation of the first embodiment of the molded article comprises the first step of applying the above-mentioned electrically conductive paint composition on a transparent plastic release film to form a coating, the second step of curing the coating to form the electrically conductive film, the third step of forming a transparent resin layer on a transparent plastic molded article, the fourth step of laminating the electrically conductive film of the release film on the transparent resin layer of the molded article, and the fifth step of releasing the release film from the electrically conductive film.

The transparent resin layer is usually made of saturated thermoplastic resin, preferably polyester resin, which is exemplified by copolymer of polyol and polyvalent carboxylic acid.

The polyvalent carboxylic acid includes, among others, aromatic dicarboxylic acid such as terephthalic acid, isophthalic acid, orthophthalic acid; aliphatic dicarboxylic acid such as 1,4-cyclohexanedicarboxylic acid, succinic acid, glutaric acid, adipic acid, suberic acid, azelaic acid, sebacic acid, dodecanedioic acid.

Examples of polyol include, among others, ethyleneglycol, 1,2-propyleneglycol, 1,4-butane diol, 1,5-pentane diol, 1,6-hexane diol, neopentylglycol, diethyleneglycol, triethyleneglycol, polyethyleneglycol, polytetramethylene glycol, 1,4-cyclohexanedimethanol, bisphenol A ethyleneoxide adducts.

Commercially available products of the saturated polyester resin are exemplified by "Chemit" produced by Toray Inc., "Viron" produced by Toyoboseki Co., Ltd., "Vitel" produced by Goodyear Inc., and the like.

The softening point of the saturated polyester resin is preferably 50 to 150° C., because the resin is hard to handle owing to strong adhesivity if too low, and heat deformation of substrate can be caused in lamination owing to elevated temperature if too high. The above-mentioned softening point is measured by ring and ball method.

An example of the process for preparation of the second embodiment of the molded article comprises the first step of applying the above-mentioned photo-setting type electrically conductive paint composition on first transparent plastic release film to form a coating, the second step of curing the coating to form the electrically conductive film by irradiating it with active rays of light such as ultraviolet ray or visible ray, the third step of forming a transparent resin layer on second transparent plastic release film, the fourth step of laminating the transparent resin layer of the second release film on a transparent molded article, the fifth step of releasing the second release film from the transparent resin layer, the sixth step of laminating the electrically conductive film of the first release film on the transparent resin layer transferred on the molded article, and the seventh step of releasing the first release film from the electrically conductive film.

The first and second release films and the photo-setting type electrically conductive paint composition can be the same as those mentioned above.

In the process for preparation of the second embodiment of the molded article, the materials of the transparent resin layer can be the same saturated polyester resin as those of the first embodiment of the molded article.

Since the first and second electrically conductive paint compositions according to the present invention are constituted as above, they are easily cured by active rays of light such as ultraviolet rays and visible rays to form the electrically conductive film, and the third electrically conductive paint composition is easily cured by heat treatment. The obtained electrically conductive film is excellent in surface hardness, chemical resistance, abrasion resistance, and the electrical conductivity, transparency and the paint compositions has good storability.

The electrically conductive paint compositions of the invention are used as antistatic materials such as semiconductor appliance etc.

BEST MODE FOR CARRYING OUT THE INVENTION

Some of the preferred embodiments of the invention are described in detail below.

EXAMPLE 1

Preparation of Anilinic Polymer 160 g (0.8 mole) of p-toluene sulfonic acid was dissolved in 1000 ml of deionized water and the obtained solution was divided into two portions of 500 ml each. To one of them was added 36.5 ml (0.4 mol) of aniline, while to the other was added 91 g of ammonium peroxodisulfate. Then, in a separable flask reactor furnished with condenser, agitator and dripping funnel, was charged the above-mentioned p-toluene sulfonic acid aqueous solution containing aniline, and while suppressing temperature rise in water bath, was dripped 500 ml of the p-toluene sulfonic acid aqueous solution containing ammonium peroxodisulfate over 30 minutes and the resulting mixture was agitated for 3 hours.

The sediment was filtered off and washed with methanol fully, and a green powder of anilinic polymer was obtained. (mean particle size: 0.3 μm).
Preparation of Anilinic Polymer Dispersion
Anilinic polymer obtained: 20 parts by weight
Polymethylmethacrylate: 40 parts by weight
  (Negami Co., Ltd. "Hipearl HPA")
  weight-average molecular weight: 500,000
Xylene: 140 parts by weight
  The obtained composition was treated with attritor for 8 hours to finely divide the anilinic polymer, thereby preparing anilinic polymer dispersion.
  It was observed with electron microscope that the anilinic polymer particle has less than 0.01 μm of mean particle size.
Preparation of Electrically Conductive Paint Composition
Anilinic polymer dispersion: 100 parts by weight
Dipentaerythritol hexaacrylate: 100 parts by weight
  (Nippon Kayaku Co., Ltd., "DPHA")
2,4-Diethylthioxanthone: 0.1 part by weight
  (Nippon Kayaku Co., Ltd., "Kayacure DETX")
Ethyl 4-dimethylaminobenzoate: 0.1 part by weight
Xylene: 150 parts by weight
  The composition was agitated with attritor for 20 minutes to prepare electrically conductive paint composition.
Preparation of Electrically Conductive Film
  The electrically conductive paint composition was applied on a transparent polymethylmethacrylate plate by bar coating method, and an exposure of 1000 mJ/cm$^2$ was emitted by a high pressure mercury lamp, thereby forming an electrically conductive film of 2 μm thick.

EXAMPLE 2

Anilinic polymer dispersion obtained in Example 1: 100 parts by weight
Hexafunctional urethane acrylate: 100 parts by weight
  (Kyoeisha Yushi Co., Ltd., "UA-306T")
2,4-Diethylthioxanthone: 0.1 part by weight
Ethyl 4-dimethylanimobenzoate: 0.1 part by weight
Xylene: 150 parts by weight
  The composition was agitated with attritor for 20 minutes to prepare electrically conductive paint composition. An electrically conductive film of 2 μm thick was formed using the electrically conductive paint composition in the same procedure as in Example 1.

EXAMPLE 3

Anilinic polymer dispersion obtained in Example 1: 100 parts by weight
Polyester acrylate: 100 parts by weight
  (Toa Gosei Chemical Co., Ltd., "M-9050")
2,4-Diethylthioxanthone: 0.1 part by weight
Ethyl 4-dimethylaminobenzoate: 0.1 part by weight
Xylene: 150 parts by weight
  The composition was agitated with attritor for 20 minutes to prepare electrically conductive paint composition. An electrically conductive film of 2 μm thick was formed in the same procedure as in Example 1.

EXAMPLE 4

Anilinic polymer dispersion obtained in Example 1: 100 parts by weight
Tetramethylolmethane tetraacrylate: 100 parts by weight
  (Shinnakamura Chemical Co., Ltd., "A-TMMT")
2,4-Diethylthioxanthone: 0.1 part by weight
Ethyl 4-dimethylaminobenzoate: 0.1 part by weight
Xylene: 150 parts by weight
  The composition was agitated with attritor for 20 minutes to prepare electrically conductive paint composition. An electrically conductive film of 2 μm thick was formed in the same procedure as in Example 1.

EXAMPLE 5

Anilinic polymer dispersion obtained in Example 1: 5 parts by weight
Tetramethylolmethane tetraacrylate: 100 parts by weight
  (Shinnakamura Chemical Co., Ltd., "A-TMMT")
2,4-Diethylthioxanthone: 0.1 part by weight
Ethyl 4-dimethylaminobenzoate: 0.1 part by weight
Xylene: 150 parts by weight
  The composition was agitated with attritor for 20 minutes to prepare electrically conductive paint composition. An electrically conductive film of 2 μm thick was formed in the same procedure as in Example 1.

EXAMPLE 6

Preparation of Anilinic Polymer Dispersion
Anilinic polymer obtained in Example 1: 20 parts by weight
Polymethylmethacrylate: 80 parts by weight
(Negami Co., Ltd. "Hipearl HPA",
weight-average molecular weight: 500,000)
xylene: 100 parts by weight The obtained composition was treated with attritor for 8 hours to finely divide the anilinic polymer, thereby preparing anilinic polymer dispersion.

It was observed with electron microscope that the anilinic polymer particle has less than 0.01 μm of mean particle size.

Preparation of Electrically Conductive Paint Composition
Anilinic polymer dispersion: 100 parts by weight
Dipentaerythritol hexaacrylate: 100 parts by weight
2,4-Diethylthioxanthone: 0.1 part by weight
Ethyl 4-dimethylaminobenzoate: 0.1 part by weight
Xylene: 150 parts by weight The composition was agitated with attritor for 20 minutes to prepare electrically conductive paint composition. An electrically conductive film of 2 μm thick was formed in the same procedure as in Example 1.

COMPARATIVE EXAMPLE 1

Preparation of Anilinic Polymer Dispersion
Anilinic polymer obtained in Example 1: 20 parts by weight
Xylene: 180 parts by weight The obtained composition was treated with attritor for 8 hours to finely divide the anilinic polymer, thereby anilinic polymer dispersion was prepared.

Preparation of Electrically Conductive Paint Composition
Anilinic polymer dispersion: 100 parts by weight
Dipentaerythritol hexaacrylate: 100 parts by weight
2,4-Diethylthioxanthone: 0.1 part by weight
Ethyl 4-dimethylaminobenzoate: 0.1 part by weight
Xylene: 150 parts by weight The composition was agitated with attritor for 20 minutes to prepare electrically conductive paint composition. An electrically conductive film of 2 μm thick was formed in the same procedure as in Example 1.

COMPARATIVE EXAMPLE 2

Preparation of Anilinic Polymer Dispersion
Anilinic polymer dispersion obtained in Example 1: 2 parts by weight
Dipentaerythritol hexaacrylate: 100 parts by weight
2,4-Diethylthioxanthone: 0.1 part by weight
Ethyl 4-dimethylaminobenzoate: 0.1 part by weight
Xylene: 150 parts by weight The composition was agitated with attritor for 20 minutes to prepare electrically conductive paint composition. An electrically conductive film of 2 μm thick was formed in the same procedure as in Example 1.

COMPARATIVE EXAMPLE 3

Preparation of Anilinic Polymer Dispersion
Anilinic polymer dispersion obtained in Example 1: 500 parts by weight
Dipentaerythritol hexaacrylate: 100 parts by weight
2,4-Diethylthioxanthone: 0.1 part by weight
Ethyl 4-dimethylaminobenzoate: 0.1 part by weight
Xylene: 150 parts by weight The composition was agitated with attritor for 20 minutes to prepare electrically conductive paint composition. An electrically conductive film of 2 μm thick was formed in the same procedure as in Example 1.

EXAMPLE 7

Preparation of Organodielectric Polymer Paint
Anilinic polymer obtained in Example 1: 10 parts by weight
γ-methacryloxypropyltrimethoxysilane
(Shinetu Chemical Co., Ltd. "KBM-503"): 5 parts by weight
Dipentaerythritol hexaacrylate: 100 parts by weight
(Nippon Kayaku Co., Ltd., "DPHA")
2,4-Diethylthioxanthone: 1 part by weight
Ethyl 4-dimethylaminobenzoate: 1 part by weight
Polymethylmethacrylate: 50 parts by weight
(Negami Co., Ltd. "Hipearl HPA")
weight-average molecular weight: 500,000
Xylene: 600 parts by weight The obtained composition was treated with attritor for 8 hours to finely divide the anilinic polymer, thereby preparing an electrically conductive paint composition.

It was observed with electron microscope that the anilinic polymer particle has less than 0.01 μm of mean particle size.

Preparation of Electrically Conductive Film
An electrically conductive film of 2 μm thick was formed using the electrically conductive paint composition in the same procedure as in Example 1.

EXAMPLE 8

An electrically conductive film was formed in the same procedure as in Example 1, except that the amount of γ-methacryloxypropyltrimethoxysilane in Example 7 was changed from 5 parts by weight to 0.3 part by weight.

EXAMPLE 9

An electrically conductive film was formed in the same procedure as in Example 7, except that 5 parts by weight of γ-methacryloxypropyltrimethoxysilane in Example 7 was changed to 5 parts by weight of isopropyltriisostearoyltitanate (Ajinomoto Co., Ltd., "KR-TTS").

EXAMPLE 10

An electrically conductive film was formed in the same procedure as in Example 7, except that 5 parts by weight of γ-methacryloxypropyltrimethoxysilane in Example 7 was changed to 0.3 part by weight of isopropyltriisostearoyltitanate (Ajinomoto Co., Ltd., "KR-TTS").

EXAMPLE 11

An electrically conductive film of 2 μm thick was formed in the same procedure as in Example 7, except that the amount of Anilinic polymer in Example 7 was changed from 10 parts by weight to 0.5 part by weight.

EXAMPLE 12

An electrically conductive film of 2 μm thick was formed in the same procedure as in Example 7, except that the amount of Anilinic polymer in Example 7 was changed from 10 parts by weight to 25 parts by weight.

EXAMPLE 13

An electrically conductive film was formed in the same procedure as in Example 7, except that 5 parts by weight of γ-methacryloxypropyltrimethoxysilane in Example 7 was changed to 5 parts by weight of γ-glycidoxypropyltrimethoxysilane.

EXAMPLE 14

An electrically conductive film was formed in the same procedure as in Example 7, except that 5 parts by weight of γ-methacryloxypropyltrimethoxysilane in Example 7 was changed to 0.3 part by weight of γ-glycidoxypropyltrimethoxysilane.

EXAMPLE 15

An electrically conductive film was formed in the same procedure as in Example 7, except that 5 parts by weight of γ-methacryloxypropyltrimethoxysilane in Example 7 was changed to 5 parts by weight of tetraisopropyl bis (dioctlyphosphate)titanate.

EXAMPLE 16

An electrically conductive film was formed in the same procedure as in Example 7, except that 5 parts by weight of γ-methacryloxypropyltrimethoxysilane in Example 7 was changed to 0.3 part by weight of tetraisopropyl bis (dioctlyphosphate)titanate.

EXAMPLE 17

Preparation of Anilinic Polymer Dispersion
Anilinic polymer powder: 20 parts by weight
(Allied Signal INC. "Versicon")
Polymethylmethacrylate: 40 parts by weight
(Negami Co., Ltd. "Hipearl HPA")
weight-average molecular weight: 500,000
Xylene: 140 parts by weight The obtained composition was treated with attritor for 8 hours to finely divide the anilinic polymer, thereby preparing anilinic polymer dispersion.
Preparation of Electrically Conductive Paint Composition
Anilinic polymer dispersion: 100 parts by weight
Dipentaerythritol hexaacrylate: 100 parts by weight
(Nippon Kayaku Co., Ltd., "DPHA")
2,4-Diethylthioxanthone: 0.1 part by weight
Ethyl 4-dimethylaminobenzoate: 0.1 part by weight
Xylene: 150 parts by weight
The mean particle size of anilinic polymer particle after dispersion: 0.02 μm
Preparation of Electrically Conductive Film Electrically conductive paint composition was prepared in the same manner. An electrically conductive film of 2 μm thick was formed using the electrically conductive paint composition in the same procedure as in Example 1.

EXAMPLE 18

An electrically conductive film was formed in the same procedure as in Example 17, except that the amount of anilinic polymer dispersion was changed from 100 parts by weight to 2 parts by weight.

EXAMPLE 19

Changing organic solvent to methylisobutylketone and ethylcellosolve, electrically conductive paint composition consisting of the following components was prepared in the same procedure as in Example 1.
Dipentaerythritol hexaacrylate: 100 parts by weight
(Nippon Kayaku Co., Ltd., "DPHA")
Anilinic polymer obtained in Example 1: 3.5 parts by weight
Polymethylmethacrylate: 22 parts by weight
(Negami Co., Ltd. "Hipearl HPA")
weight-average molecular weight: 500,000
2,4-Diethylthioxanthone: 3.1 parts by weight
Ethyl 4-dimethylaminobenzoate: 3.0 parts by weight
Methylisobutylketone: 120 parts by weight
Ethylcellosolve: 480 parts by weight An electrically conductive film of 2 μm thick was formed using the electrically conductive paint composition in the same procedure as in Example 1.

EXAMPLE 20

Electrically conductive paint composition consisting of the following components was prepared in the same procedure as in Example 19.
Dipentaerythritol hexaacrylate: 100 parts by weight
(Nippon Kayaku Co., Ltd., "DPHA")
Anilinic polymer obtained in Example 1: 3.5 parts by weight
Polymethylmethacrylate: 22 parts by weight
(Negami Co., Ltd. "Hipearl HPA")
weight-average molecular weight: 300,000
2,4-Diethylthioxanthone: 3.0 parts by weight
Ethyl 4-dimethylaminobenzoate: 3.0 parts by weight
Methylisobutylketone: 120 parts by weight
Ethylcellosolve: 480 parts by weight An electrically conductive film of 2 μm thick was formed using the electrically conductive paint composition in the same procedure as in Example 1.

EXAMPLE 21

Electrically conductive paint composition consisting of the following components was prepared in the same procedure as in Example 19.
Dipentaerythritol hexaacrylate: 100 parts by weight
(Nippon Kayaku Co., Ltd., "DPHA")
Anilinic polymer obtained in Example 1: 3.5 parts by weight
Polymethylmethacrylate: 22 parts by weight
(Negami Co., Ltd. "Hipearl HPA")
weight-average molecular weight: 700,000
2,4-Diethylthioxanthone: 3.0 parts by weight
Ethyl 4-dimethylaminobenzoate: 3.0 parts by weight
Methylisobutylketone: 120 parts by weight
Ethylcellosolve: 480 parts by weight An electrically conductive film of 2 μm thick was formed using the electrically conductive paint composition in the same procedure as in Example 1.

EXAMPLE 22

Changing polymethylmethacrylate in example 19 to butylacrylate/methylmethacrylate copolymer, electrically conductive paint composition consisting of the following components was prepared in the same procedure as in Example 19.
Dipentaerythritol hexaacrylate: 100 parts by weight
(Nippon Kayaku Co., Ltd., "DPHA")
Anilinic polymer obtained in Example 1: 3.5 parts by weight
Butylacrylate/methylmethacrylate copolymer: 22 parts by weight
(Negami Co., Ltd. "Hipearl M-6402")
weight-average molecular weight: 330,000
2,4-Diethylthioxanthone: 3.0 parts by weight
Ethyl 4-dimethylaminobenzoate: 3.0 parts by weight
Methylisobutylketone: 120 parts by weight
Ethylcellosolve: 480 parts by weight An electrically conductive film of 2 μm thick was formed using the electrically conductive paint composition in the same procedure as in Example 1.

EXAMPLE 23

Electrically conductive paint composition was prepared in the same procedure as in Example 22. An electrically conductive film of 4 μm thick was formed using the electrically conductive paint composition in the same procedure as in Example 1.

COMPARATIVE EXAMPLE 4

An electrically conductive film was formed in the same procedure as in Example 7, except that 5 parts by weight of γ-methacryloxypropyltrimethoxysilane in Example 7 was changed to 0.05 part by weight of γ-methacryloxypropyltrimethoxysilane.

COMPARATIVE EXAMPLE 5

An electrically conductive film was formed in the same procedure as in Example 7, except that 5 parts by weight of γ-methacryloxypropyltrimethoxysilane in Example 7 was changed to 20 parts by weight of γ-methacryloxypropyltrimethoxysilane.

COMPARATIVE EXAMPLE 6

An electrically conductive film was formed in the same procedure as in Example 7, except that 5 parts by weight of γ-methacryloxypropyltrimethoxysilane in Example 7 was changed to 0.05 part by weight of isopropyltriisostearoyltitanate.

COMPARATIVE EXAMPLE 7

An electrically conductive film was formed in the same procedure as in Example 7, except that 5 parts by weight of γ-methacryloxypropyltrimethoxysilane in Example 7 was changed to 20 parts by weight of isopropyltriisostearoyltitanate.

COMPARATIVE EXAMPLE 8

(described in Japanese Laid-open Patent Hei 3-137,121)

Electrically conductive paint composition consisting of the following components was prepared.
Epoxymethacrylate: 100 parts by weight
 (Showa kobunshi Co., Ltd. "R804")
Anilinic polymer: 17 parts by weight
Modifier (Shell Chemical Co., Ltd. "SBS TR1184"): 23 parts by weight
Benzoyl isopropyl ether: 1 part by weight
 An electrically conductive film of 30 μm thick was formed using the electrically conductive paint composition in the same procedure as in Example 1.

EXAMPLE 24

Preparation of Electrically Conductive Paint Composition
Anilinic polymer dispersion obtained in Example 1 (mean particle size of anilinic polymer: 0.01 μm or less): 100 parts by weight
Dipentaerythritol hexaacrylate: 80 parts by weight
 (Nippon Kayaku Co., Ltd., "DPHA")
Unsaturated polyester resin: 20 parts by weight
 (Showa kobunshi Co., Ltd. "Rigorack G-2141")
Cobalt naththenate (metal content: 6% by weight): 0.2 part by weight
Solution of methylethylketoneperoxide in dimethylphthalate (55% by weight): 2.0 parts by weight
Xylene: 150 parts by weight
Preparation of Electrically Conductive Film The composition was agitated with attritor for 20 minutes to prepare electrically conductive paint composition.

The electrically conductive paint composition was applied on a polymethylmethacrylate plate by bar coating method, and cured by heating at 80° C. for 30 minutes, thereby forming an electrically conductive film of 2 μm thick.

EXAMPLE 25

Anilinic polymer dispersion obtained in Example 1: 100 parts by weight
Dipentaerythritol hexaacrylate: 50 parts by weight
 (Nippon Kayaku Co., Ltd., "DPHA")
Unsaturated polyester resin: 50 parts by weight
 (Showa kobunshi Co., Ltd. "Rigorack G-2141")
Cobalt naththenate
 (metal content: 6% by weight): 0.2 part by weight
Solution of methylethylketoneperoxide in dimethylphthalate (55% by weight): 2.0 parts by weight
Xylene: 150 parts by weight
 An electrically conductive film of 2 μm thick was formed using the obtained composition in the same manner as Example 24.

EXAMPLE 26

Anilinic polymer dispersion obtained in Example 1: 100 parts by weight
Dipentaerythritol hexaacrylate: 80 parts by weight
 (Nippon Kayaku Co., Ltd., "DPHA")
Epoxy resin: 20 parts by weight
 (Yuka Shell Showa Epoxy Co., Ltd. "Epicoat 828")
Diethylenetriamine: 1 part by weight
Xylene: 150 parts by weight
 An electrically conductive film of 2 μm thick was formed using the obtained composition in the same manner as Example 24.

EXAMPLE 27

Anilinic polymer dispersion obtained in Example 1: 100 parts by weight
Dipentaerythritol hexaacrylate: 50 parts by weight
 (Nippon Kayaku Co., Ltd., "DPHA")
Epoxy resin: 50 parts by weight
Diethylentriamine: 1 part by weight
Xylene: 150 parts by weight
 An electrically conductive film of 2 μm thick was formed using the obtained composition in the same manner as Example 24.

EXAMPLE 28

Anilinic polymer dispersion obtained in Example 1: 100 parts by weight
Dipentaerythritol hexaacrylate: 80 parts by weight
 (Nippon Kayaku Co., Ltd., "DPHA")
Hexamethylenediisocyanate: 7 parts by weight
Polyethyleneglycol: 13 parts by weight
 (average molecular weight: 458)
Dibutyl tindilaurate: 1 part by weight
Xylene: 150 parts by weight
 An electrically conductive film of 2 μm thick was formed using the obtained composition in the same manner as Example 24.

EXAMPLE 29

Anilinic polymer dispersion obtained in Example 1: 100 parts by weight
Dipentaerythritol hexaacrylate: 50 parts by weight
  (Nippon Kayaku Co., Ltd., "DPHA")
Hexamethylenediisocyanate: 18 parts by weight
Polyethyleneglycol: 32 parts by weight
  (average molecular weight: 458)
Dibutyl tindilaurate: 1 part by weight
Xylene: 150 parts by weight
  An electrically conductive film of 2 $\mu$m thick was formed using the obtained composition in the same manner as Example 24.

EXAMPLE 30

Anilinic polymer dispersion obtained in Example 1: 10 parts by weight
Dipentaerythritol hexaacrylate: 80 parts by weight
  (Nippon Kayaku Co., Ltd., "DPHA")
Unsaturated polyester resin: 20 parts by weight
  (Showa kobunshi Co., Ltd. "Rigorack G-2141")
Cobalt naththenate (metal content: 6% by weight) 0.2 part by weight
Solution of methylethylketoneperoxide in dimethylphthalate (55% by weight): 2.0 parts by weight
Xylene: 150 parts by weight
  An electrically conductive film of 2 $\mu$m thick was formed using the obtained composition in the same manner as Example 24.

EXAMPLE 31

Anilinic polymer dispersion obtained in Example 1: 200 parts by weight
Dipentaerythritol hexaacrylate: 80 parts by weight
  (Nippon Kayaku Co., Ltd., "DPHA")
Unsaturated polyester resin: 20 parts by weight
  (Showa kobunshi Co., Ltd. "Rigorack G-2141")
Cobalt naththenate (metal content: 6% by weight): 0.2 part by weight
Solution of methylethylketoneperoxide in dimethylphthalate (55% by weight): 2.0 parts by weight
Xylene: 150 parts by weight
  An electrically conductive film of 2 $\mu$m thick was formed using the obtained composition in the same manner as Example 24.

EXAMPLE 32

Anilinic polymer dispersion obtained in Example 1: 100 parts by weight
Dipentaerythritol hexaacrylate: 100 parts by weight
  (Nippon Kayaku Co., Ltd., "DPHA")
Cobalt naththenate (metal content: 6% by weight): 0.2 part by weight
Solution of methylethylketoneperoxide in dimethylphthalate: (55% by weight): 2.0 parts by weight
Xylene: 150 parts by weight
  An electrically conductive film of 2 $\mu$m thick was formed using the obtained composition in the same manner as Example 24.

EXAMPLE 33

Anilinic polymer powder: 5 parts by weight
  (Allied Signal INC. Ltd. "Versicon", mean particle size: 3 to 100 $\mu$m)
Polymethylmethacrylate: 5 parts by weight
Xylene: 100 parts by weight
  The obtained composition was treated with attritor for 8 hours to finely divide the anilinic polymer(mean particle size: 0.1 to 0.2 $\mu$m ). 90 parts by weight of pentaerythritol triacrylate (Nippon Kayaku Co., Ltd., "Kayarad PET-30") and 1 part by weight of the solution of methylethylketoneperoxide in dimethylphthalate (55% by weight) (Kishida Chemical Co., Ltd.) were added thereto and the whole was agitated with attritor for 5 minutes, and then 800 parts by weight of xylene was added to adjust the solid content to 10% by weight, thereby preparing electrically conductive paint composition.
  The electrically conductive paint composition was applied on a polymethylmethacrylate plate by dipping method, and cured by heating at 120° C. for 2 hours, thereby forming an electrically conductive film of 2 $\mu$m thick.

COMPARATIVE EXAMPLE 9

Preparation of Anilinic Polymer Dispersion
Anilinic polymer obtained in Example 1: 20 parts by weight
Xylene: 180 parts by weight
  The composition was agitated with attritor for 8 hours to finely divide the anilinic polymer, thereby preparing anilinic polymer dispersion.
Preparing of Electrically Conductive Paint Composition
Anilinic polymer dispersion: 100 parts by weight
Dipentaerythritol hexaacrylate: 80 parts by weight
  (Nippon Kayaku Co., Ltd., "DPHA")
Unsaturated polyester resin: 20 parts by weight
  (Showa kobunshi Co., Ltd. "Rigorack G-2141")
Cobalt naththenate (metal content: 6% by weight): 0.2 part by weight
Solution of methylethylketoneperoxide in dimethylphthalate (55% by weight): 2.0 parts by weight
Xylene: 150 parts by weight
  An electrically conductive film of 2 $\mu$m thick was formed using the obtained composition in the same manner as Example 24.

COMPARATIVE EXAMPLE 10

Anilinic polymer dispersion obtained in Example 1: 0.5 parts by weight
Dipentaerythritol hexaacrylate: 80 parts by weight
  (Nippon Kayaku Co., Ltd., "DPHA")
Unsaturated polyester resin: 20 parts by weight
  (Showa kobunshi Co., Ltd. "Rigorack G-2141")
Cobalt naththenate
  (metal content: 6% by weight): 0.2 part by weight
Solution of methylethylketoneperoxide in dimethylphthalate (55% by weight): 2.0 parts by weight
Xylene: 150 parts by weight
  An electrically conductive film of 2 $\mu$m thick was formed using the obtained composition in the same manner as Example 24.

COMPARATIVE EXAMPLE 11

Anilinic polymer dispersion obtained in Example 1: 500 parts by weight
Dipentaerythritol hexaacrylate: 80 parts by weight
  (Nippon Kayaku Co., Ltd., "DPHA")

Unsaturated polyester resin: 20 parts by weight
  (Showa kobunshi Co., Ltd. "Rigorack G-2141")
Cobalt naththenate
  (metal content: 6% by weight): 0.2 part by weight
Solution of methylethylketoneperoxide in dimethylphthalate
  (55% by weight): 2.0 parts by weight
Xylene: 150 parts by weight An electrically conductive film of 2 μm thick was formed using the obtained composition in the same manner as Example 24.

COMPARATIVE EXAMPLE 12

Anilinic polymer dispersion obtained in Example 1: 100 parts by weight
Unsaturated polyester resin: 100 parts by weight
  (Showa kobunshi Co., Ltd. "Rigorack G-2141")
Cobalt naththenate (metal content: 6% by weight): 0.2 part by weight
Solution of methylethylketoneperoxide in dimethylphthalate
  (55% by weight): 2.0 parts by weight
Xylene: 150 parts by weight An electrically conductive film of 2 μm thick was formed using the obtained composition in the same manner as Example 24.

EXAMPLE 34

Preparation of Electrically Conductive Film

Electrically conductive paint composition was prepared in the same procedure as in Example 1. The obtained composition was applied on a polyethyleneterephthalate (hereinafter referred to as the "PET") film (Teijin, Ltd., "Tetron Film", 25 μm thick) with bar coater, thereby forming a coating of 2 μm thick.

The resulting coating was laminated on an acrylic resin plate by hot pressing at a temperature of 90° C. and a pressure of 4 kg/cm². Next, an exposure of 1000 mJ/cm² was emitted by a high pressure mercury lamp, thereby forming an electrically conductive film of 2 μm thick. Then the PET was released to obtain an antistatic transparent plastic plate coated with the electrically conductive film.

EXAMPLE 35

Electrically conductive paint composition was prepared in the same procedure as in Example 34, except that 100 parts by weight of hexafunctional urethane acrylate (Kyoeisha Yushi Co., Ltd., "UA-306T") was used instead of dipentaerythritol hexaacrylate. Then using the composition, an antistatic transparent plastic plate of which the acrylic resin plate was coated with the electrically conductive film of 2 μm thick was prepared in the same procedure as in Example 34.

EXAMPLE 36

Electrically conductive paint composition was prepared in the same procedure as in Example 34, except that 100 parts by weight of polyester acrylate (Toa Gosei Chemical Co., Ltd., "M-9050") was used instead of dipentaerythritol hexaacrylate. Then using the composition, an antistatic transparent plastic plate of which the acrylic resin plate was coated with the electrically conductive film of 2 μm thick was prepared in the same procedure as in Example 34.

EXAMPLE 37

Electrically conductive paint composition was prepared in the same procedure as in Example 34, except that 100 parts by weight of tetramethylolmethane tetraacrylate (Shinnakamura Chemical Co., Ltd., "A-TMMT") was used instead of dipentaerythritol hexaacrylate. Then using the composition, an antistatic transparent plastic plate of which the acrylic resin plate was coated with the electrically conductive film of 2 μm thick was prepared in the same procedure as in Example 34.

EXAMPLE 38

Electrically conductive paint composition was prepared in the same procedure as in Example 34, except that the amount of anilinic polymer dispersion obtained in Example 1 was changed to 20 parts by weight. Then using the composition, an antistatic transparent plastic plate of which the acrylic resin plate was coated with the electrically conductive film of 2 μm thick was prepared in the same procedure as in Example 34.

EXAMPLE 39

Electrically conductive paint composition was prepared in the same procedure as in Example 34, except that 100 parts by weight of anilinic polymer dispersion obtained in Example 6 was used instead of anilinic polymer dispersion obtained in Example 1. Then using the composition, an antistatic transparent plastic plate of which the acrylic resin plate was coated with the electrically conductive film of 2 μm thick was prepared in the same procedure as in Example 34.

EXAMPLE 40

Electrically conductive paint composition was prepared in the same procedure as in Example 34, except that 100 parts by weight of anilinic polymer dispersion obtained in Example 17 was used instead of anilinic polymer dispersion obtained in Example 1. Then using the composition, a antistatic transparent plastic plate of which the acrylic resin plate was coated with the electrically conductive film of 2 μm thick was prepared in the same procedure as in Example 34.

EXAMPLE 41

Electrically conductive paint composition was prepared in the same procedure as in Example 40, except that the amount of anilinic polymer dispersion obtained in Example 17 was changed to 2 parts by weight. Then using the composition, an antistatic transparent plastic plate of which the acrylic resin plate was coated with the electrically conductive film of 2 μm thick was prepared in the same procedure as in Example 34.

COMPARATIVE EXAMPLE 13

Electrically conductive paint composition was prepared in the same procedure as in Example 34, except that 100 parts by weight of anilinic polymer dispersion obtained in Comparative Example 1 was used instead of anilinic polymer dispersion obtained in Example 1. Then using the composition, an antistatic transparent plastic plate of which the acrylic resin plate was coated with the electrically conductive film of 2 μm thick was prepared in the same procedure as in Example 34.

COMPARATIVE EXAMPLE 14

Electrically conductive paint composition was prepared in the same procedure as in Example 34, except that the amount of anilinic polymer dispersion obtained in Example 1 was changed to 2 parts by weight. Then using the composition, an antistatic transparent plastic plate of which the acrylic resin plate was coated with the electrically conductive film of 2 μm thick was prepared in the same procedure as in Example 34.

COMPARATIVE EXAMPLE 15

Electrically conductive paint composition was prepared in the same procedure as in Example 34, except that the amount of anilinic polymer dispersion obtained in Example 1 was changed to 500 parts by weight. Then using the composition, an antistatic transparent plastic plate of which the acrylic resin plate was coated with the electrically conductive film of 2 μm thick was prepared in the same procedure as in Example 34.

EXAMPLE 42

The electrically conductive paint composition obtained in Example 34 was applied on an acrylic resin plate by bar coating method, and an exposure of 1000 mJ/cm$^2$ was emitted by a high pressure mercury lamp, thereby preparing an antistatic transparent plastic plate of which the acrylic resin plate was coated with the electrically conductive film of 2 μm thick.

EXAMPLE 43

An antistatic transparent plastic plate coated with the electrically conductive film was prepared in the same procedure as in Example 42, except that the electrically conductive paint composition obtained in Example 35 was used.

EXAMPLE 44

An antistatic transparent plastic plate coated with the electrically conductive film was prepared in the same procedure as in Example 42, except that the electrically conductive paint composition obtained in Example 36 was used.

EXAMPLE 45

An antistatic transparent plastic plate coated with the electrically conductive film was prepared in the same procedure as in Example 42, except that the electrically conductive paint composition obtained in Example 37 was used.

EXAMPLE 46

An antistatic transparent plastic plate coated with the electrically conductive film was prepared in the same procedure as in Example 42, except that the electrically conductive paint composition obtained in Example 38 was used.

EXAMPLE 47

An antistatic transparent plastic plate coated with the electrically conductive film was prepared in the same procedure as in Example 42, except that the electrically conductive paint composition obtained in Example 39 was used.

EXAMPLE 48

An antistatic transparent plastic plate coated with the electrically conductive film was prepared in the same procedure as in Example 42, except that the electrically conductive paint composition obtained in Example 40 was used.

EXAMPLE 49

An antistatic transparent plastic plate coated with the electrically conductive film was prepared in the same procedure as in Example 42, except that the electrically conductive paint composition obtained in Example 41 was used.

EXAMPLE 50

Preparation of Composition for Transparent Resin Layer
Saturated polyester resin: 30 parts by weight
 (Toray Inc. "Chemit R-99")
Methylethylketone: 14 parts by weight
Toluene: 56 parts by weight These components were mixed to prepare composition for transparent resin layer.

The electrically conductive paint composition obtained in Example 34 was applied on a PET film with bar coater, thereby forming a coating of 2 μm thick. Next, an exposure of 1000 mJ/cm$^2$ was emitted by a high pressure mercury lamp, thereby forming an electrically conductive film.

Separately, the composition for transparent resin layer was applied on an acrylic resin plate with bar coater, thereby forming an transparent resin layer of 2 μm thick.

The electrically conductive film was laminated on the transparent resin layer by hot pressing at a temperature of 90° C. and a pressure of 4 kg/cm$^2$. Then the PET film was released from the electrically conductive film to obtain an antistatic transparent plastic plate coated with the electrically conductive film of 2 μm thick.

EXAMPLE 51

An antistatic transparent plastic plate coated with the electrically conductive film of 2 μm thick was prepared in the same procedure as in Example 50, except that 30 parts by weight of saturated polyester resin (Toray Inc. "Chemit R-274") was used as a component of the composition.

EXAMPLE 52

The electrically conductive paint composition obtained in Example 50 was applied on first PET film with bar coater, thereby forming a coating of 2 μm thick. Next, an exposure of 1000 mJ/cm$^2$ was emitted by a high pressure mercury lamp, thereby forming an electrically conductive film.

Separately, the composition for transparent resin layer obtained in Example 50 was applied on second PET Film with bar coater, thereby forming an transparent resin layer of 2 μm thick.

The electrically conductive film was laminated on the transparent resin layer by hot pressing at a temperature of 90° C. and a pressure of 4 kg/cm$^2$. Then the first PET film was released from the electrically conductive film to obtain an antistatic transparent plastic plate coated with the electrically conductive film of 2 μm thick.

EXAMPLE 53

An antistatic transparent plastic plate coated with the electrically conductive film of 2 μm thick was prepared in the same procedure as in Example 52, except that 30 parts by weight of saturated polyester resin (Toray Inc. "Chemit R-274") was used as a component of the composition.

Evaluation Test of Antistatic Transparent Plastic Plate

The antistatic transparent plastic plate obtained in Examples and Comparative Examples were tested in the following performance items. The test results are shown in Table 1 to 7.

(1) Surface intrinsic resistance The test conformed to ASTM D257.
(2) Total ray transmittance The test conformed to ASTM D1003
(3) Pencil hardness This hardness was measured with pencil hardness tester, conforming to JIS K5400.
(4) Haze The cloud value was tested in accordance with ASTM D1003.
(5) Surface smoothness The average roughness(Ra) on centerline was measured in accordance with JIS B0651.
(6) Abrasion resistance The surface was observed with the eye, after moving a test piece 100 times on steel wool (#0000) under 1 kg/cm² of load.
The criteria are as follows:
1: A large number of marrings are observed.
2: A fair number of marrings are observed.
3: A couple of marrings are observed.
4: Few marrings are observed.
5: No marrings are observed.
(7) Bending workability
The plate or molded object which was coated with the electrically conductive film was heated at a temperature of 120° C. for 10 minutes, and then was bended along the surface of the pipe having a known external diameter. Observing the state of crack development in the electrically conductive film, the smallest curvature radius, there no crack developed was determined.

TABLE 1

| Example No. | Surface intrinsic resistance ($\Omega/\square$) | Total ray transmittance (%) | Surface hardness | Haze | Abrasion resistance | Bending workability |
|---|---|---|---|---|---|---|
| 1 | $2 \times 10^6$ | 80.6 | 5H | 2.7 | 5 | 60 |
| 2 | $2 \times 10^6$ | 81.0 | 5H | 2.7 | 5 | 45 |
| 3 | $1 \times 10^6$ | 80.3 | 5H | 2.8 | 5 | 45 |
| 4 | $2 \times 10^6$ | 80.8 | 5H | 2.8 | 5 | 45 |
| 5 | $2 \times 10^8$ | 81.2 | 5H | 1.5 | 5 | 70 |
| 6 | $2 \times 10^6$ | 81.5 | 5H | 2.7 | 5 | — |
| 7 | $5 \times 10^6$ | 86.1 | 5H | 2.3 | 5 | — |
| 8 | $5 \times 10^6$ | 84.5 | 5H | 2.4 | 5 | — |
| 9 | $5 \times 10^6$ | 86.4 | 5H | 2.3 | 5 | — |
| 10 | $5 \times 10^6$ | 84.3 | 5H | 2.5 | 5 | — |
| 11 | $4 \times 10^8$ | 86.2 | 5H | 2.0 | 5 | — |
| 12 | $1 \times 10^6$ | 83.9 | 5H | 3.0 | 5 | — |
| 13 | $5 \times 10^6$ | 86.6 | 5H | 3.1 | 5 | — |
| 14 | $5 \times 10^6$ | 84.2 | 5H | 3.2 | 5 | — |
| 15 | $6 \times 10^6$ | 87.0 | 5H | 3.1 | 5 | — |
| 16 | $5 \times 10^6$ | 84.3 | 5H | 3.0 | 5 | — |
| 17 | $2 \times 10^6$ | 80.7 | 5H | 2.6 | 5 | 60 |
| 18 | $2 \times 10^8$ | 81.4 | 5H | 1.6 | 5 | — |
| 19 | $1 \times 10^8$ | 85.0 | 4H | 1.7 | 5 | 60 |
| 20 | $8 \times 10^6$ | 78.2 | 4H | 3.1 | 5 | — |
| 21 | $7 \times 10^6$ | 81.5 | 4H | 2.0 | 5 | — |
| 22 | $7 \times 10^6$ | 81.5 | 4H | 2.1 | 5 | — |
| 23 | $1 \times 10^5$ | 80.5 | 4H | 3.0 | 5 | — |

TABLE 2

| Comparative Example No. | Surface intrinsic resistance ($\Omega/\square$) | Total ray transmittance (%) | Surface hardness | Haze | Abrasion resistance | Bending workability |
|---|---|---|---|---|---|---|
| 1 | $2 \times 10^7$ | 63.3 | 5H | 4.8 | 5 | 120 |
| 2 | $3 \times 10^{12}$ | 80.4 | 5H | — | — | — |
| 3 | $<10^6$ | 61.3 | 5H | 7.4 | 3 | 15 |
| 4 | $5 \times 10^6$ | 80.9 | 5H | 2.0 | 4 | 30 |
| 5 | $5 \times 10^6$ | 87.1 | H | — | 4 | — |
| 6 | $6 \times 10^6$ | 80.6 | 5H | — | 4 | — |
| 7 | $6 \times 10^6$ | 87.3 | H | — | 4 | — |
| 8 | $2 \times 10^4$ | opaque | H | opaque | — | — |

TABLE 3

| Example No. | Surface intrinsic resistance ($\Omega/\square$) | Total ray transmittance (%) | Surface hardness | Haze | Abrasion resistance | Bending workability |
|---|---|---|---|---|---|---|
| 24 | $2 \times 10^6$ | 80.6 | 6H | 2.7 | 5 | 45 |
| 25 | $2 \times 10^6$ | 81.0 | 5H | — | — | — |
| 26 | $1 \times 10^6$ | 80.3 | 5H | 2.7 | 5 | 45 |
| 27 | $2 \times 10^6$ | 80.8 | 5H | — | — | — |
| 28 | $2 \times 10^6$ | 81.2 | 6H | 2.8 | 5 | 45 |
| 29 | $2 \times 10^6$ | 81.5 | 5H | — | — | — |
| 30 | $3 \times 10^6$ | 82.5 | 5H | — | — | — |
| 31 | $1 \times 10^6$ | 79.8 | 5H | — | — | — |
| 32 | $2 \times 10^6$ | 81.2 | 5H | — | — | — |
| 33 | $1 \times 10^7$ | — | 5H | — | — | — |

TABLE 4

| Comparative Example No. | Surface intrinsic resistance ($\Omega/\square$) | Total ray transmittance (%) | Surface hardness | Haze | Abrasion resistance | Bending workability |
|---|---|---|---|---|---|---|
| 9 | $2 \times 10^7$ | 63.6 | 5H | 4.8 | 5 | 120 |
| 10 | $3 \times 10^{12}$ | 81.0 | 5H | 1.1 | 5 | — |
| 11 | $<10^6$ | 61.3 | 5H | 1.7 | 5 | 15 |
| 12 | $2 \times 10^6$ | 80.8 | H | 2.6 | 5 | 15 |

TABLE 5

| Example No. | Surface intrinsic resistance ($\Omega/\square$) | Total ray transmittance (%) | Surface hardness | Haze | Surface smoothness ($\mu m$) | Abrasion resistance | Bending workability |
|---|---|---|---|---|---|---|---|
| 34 | $2 \times 10^6$ | 80.6 | 5H | 2.2 | 0.2 | 5 | 60 |
| 35 | $2 \times 10^6$ | 81.0 | 5H | 2.0 | 0.2 | 5 | 45 |
| 36 | $1 \times 10^6$ | 80.3 | 5H | 2.2 | 0.2 | 5 | 45 |
| 37 | $2 \times 10^6$ | 80.8 | 5H | 2.0 | 0.2 | 5 | 45 |

TABLE 5-continued

| Example No. | Surface intrinsic resistance ($\Omega/\square$) | Total ray transmittance (%) | Surface hardness | Haze | Surface smoothness ($\mu$m) | Abrasion resistance | Bending workability |
|---|---|---|---|---|---|---|---|
| 38 | $2 \times 10^8$ | 81.2 | 5H | 1.3 | 0.2 | 5 | — |
| 39 | $2 \times 10^6$ | 81.5 | 5H | 2.7 | 0.2 | 5 | — |
| 40 | $2 \times 10^6$ | 80.7 | 5H | 2.6 | 0.2 | 5 | — |
| 41 | $2 \times 10^8$ | 81.4 | 5H | 1.9 | 0.2 | 5 | — |

TABLE 6

| Comparative Example No. | Surface intrinsic resistance ($\Omega/\square$) | Total ray transmittance (%) | Surface hardness | Haze | Surface smoothness ($\mu$m) | Abrasion resistance | Bending workability |
|---|---|---|---|---|---|---|---|
| 13 | $2 \times 10^7$ | 63.6 | 5H | 3.6 | 0.2 | 5 | 120 |
| 14 | $3 \times 10^{12}$ | 80.4 | 5H | 1.2 | 0.2 | 5 | — |
| 15 | $<10^6$ | 61.3 | 5H | 5.6 | 0.2 | 5 | 15 |

TABLE 7

| Example No. | Surface intrinsic resistance | Total ray transmittance (%) | Surface hardness |
|---|---|---|---|
| 42 | $2 \times 10^6$ | 83.6 | 5H |
| 43 | $2 \times 10^6$ | 85.1 | 5H |
| 44 | $1 \times 10^6$ | 84.0 | 5H |
| 45 | $2 \times 10^6$ | 84.2 | 5H |
| 46 | $2 \times 10^8$ | 84.7 | 5H |
| 47 | $2 \times 10^6$ | 84.5 | 5H |
| 48 | $2 \times 10^6$ | 83.7 | 5H |
| 49 | $2 \times 10^8$ | 85.0 | 5H |
| 50 | $2 \times 10^6$ | 83.6 | 5H |
| 51 | $2 \times 10^6$ | 83.2 | 5H |
| 52 | $2 \times 10^6$ | 82.7 | 5H |
| 53 | $2 \times 10^6$ | 83.1 | 5H |

Industrial Applicability

The electrically conductive paint compositions according to the present invention can be easily cured by ultraviolet rays or visible rays or heating, thereby forming an electrically conductive film. The resulting electrically conductive film is excellent in surface hardness, transparency, resistance to chemicals, and abrasion resistance, and the paint compositions being excellent in storability. Thus, the electrically conductive paint compositions are suitable for antistatic materials in semiconductor-preparing processes.

We claim:

1. An electrically conductive paint composition comprising 100 parts by weight of a (meth)acrylate compound having at least two (meth)acryloyl groups in one molecule, 0.1 to 30 parts by weight of a particulate anilinic electrically conductive polymer, 1 to 100 parts by weight of an alkyl (meth)acrylate resin, 0.01 to 10 parts by weight of a photopolymerization initiator and 0 to 2000 parts by weight of an organic solvent.

2. A composition according to claim 1, wherein the anilinic electrically conductive polymer has a mean particle size of 1 $\mu$m or less.

3. A composition according to claim 1 or 2, wherein the (meth)acrylate compound has at least four (meth)acryloyl groups in one molecule.

4. A composition according to any one of claim 1 or 2, wherein a content of the anilinic electrically conductive polymer is 0.1 to 5 parts by weight.

5. A composition according to any one of claim 1 or 2, wherein a content of the alkyl (meth)acrylate resin is 5 to 25 parts by weight.

6. A composition according to any one of claim 1 or 2, wherein the alkyl (meth)acrylate resin has a molecular weight of 300,000 to 1,000,000.

7. A composition according to any one of claim 1 to or 2, which comprises further 0.1 to 10 parts by weight of a silane coupling agent and/or titanate coupling agent.

8. A composition according to any one of claim 1 to or 2, wherein the anilinic electrically conductive polymer has mean particle size of 0.4 $\mu$m or less.

9. An electrically conductive paint composition comprising 100 parts by weight of (meth)acrylate compound having at least two (meth)acryloyl groups in one molecule, 0.1 to 30 parts by weight of particulate anilinic electrically conductive polymer, 1 to 100 parts by weight of alkyl (meth)acrylate resin, 0 to 200 parts by weight of thermosetting resin and 0 to 10 parts by weight of a curing agent.

10. A composition according to claim 9, wherein the anilinic electrically conductive polymer has mean particle size of 1 $\mu$m or less.

11. A composition according to claim 9 or 10, wherein a content of the thermosetting resin is 15 to 60 parts by weight.

12. A molded article coated with an electrically conductive film made from an electrically conductive paint composition comprising 100 parts by weight of a (meth) acrylate compound having at least two (meth) acryloyl groups in one molecule, 0.1 to 30 parts by weight of a particulate anilinic electrically conductive polymer, 1 to 100 parts by weight of an alkyl (meth) acrylate resin, 0.01 to 10 parts by weight of a photopolymerization initiator and 0 to 2000 parts by weight of an organic solvent.

13. The molded article of claim 12 wherein a transparent resin layer is positioned between the molded article and the said film.

14. The molded article according to claim 12 or 13 wherein the electrically conductive film is 0.5 to 10 $\mu$m in thickness.

15. A method of making a molded article which comprises applying an electrically conductive paint composition comprising 100 parts by weight of a (meth)acrylate compound having at least two (meth)acryloyl groups in one molecule, 0.4 to 30 parts by weight of a particulate anilinic electrically conductive polymer, 1 to 100 parts by weight of an alkyl (meth)acrylate resin, 0.01 to 10 parts by weight of a photopolymerization initiator and 0 to 2000 parts by weight of an organic solvent to a release film to form a coating, laminating the coating onto a transparent plastic molded article and curing the coating to form an electrically conductive film.

16. A method of making a molded article which comprises applying an electrically conductive paint composition comprising 100 parts by weight of a (meth)acrylate compound having at least two (meth)acryloyl groups in one molecule, 0.1 to 30 parts by weight of a particulate anilinic electrically conductive polymer, 1 to 100 parts by weight of an alkyl (meth)acrylate resin, 0.01 to 10 parts by weight of a photopolymerization initiator and 0 to 2000 parts by weight of an organic solvent to a release film to form a coating, curing the coating to form an electrically conductive film, forming a transparent resin layer on a transparent plastic molded article, laminating the electrically conductive film of the release film onto the transparent resin layer of the molded article and releasing the release film from the electrically conductive film.

17. A method of making a molded article which comprises applying an electrically conductive paint composition comprising 100 parts by weight of a (meth)acrylate compound having at least two (meth)acryloyl groups in one molecule, 0.1 to 30 parts by weight of a particulate anilinic electrically conductive polymer, 1 to 100 parts by weight of an alkyl (meth)acrylate resin, 0.01 to 10 parts by weight of a photopolymerization initiator and 0 to 2000 parts by weight of an organic solvent to a first release film to form a coating, curing the coating to form an electrically conductive film, forming a transparent resin layer on a second release film, laminating the transparent resin layer of the second release film on a transparent molded article, releasing the second release film from the transparent resin layer, laminating the electrically conductive film of the first release film onto the transparent resin layer, and releasing the first release film from the electrically conductive film.

* * * * *